(12) United States Patent
Yosui

(10) Patent No.: US 9,560,766 B2
(45) Date of Patent: Jan. 31, 2017

(54) CIRCUIT BOARD AND METHOD FOR PRODUCING SAME

(71) Applicant: Murata Manufacturing Co., Ltd., Nagaokakyo-shi, Kyoto-fu (JP)

(72) Inventor: Kuniaki Yosui, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 184 days.

(21) Appl. No.: 14/621,459

(22) Filed: Feb. 13, 2015

(65) Prior Publication Data
US 2015/0163917 A1 Jun. 11, 2015

Related U.S. Application Data

(63) Continuation of application No. PCT/JP2014/050348, filed on Jan. 10, 2014.

(30) Foreign Application Priority Data

Feb. 14, 2013 (JP) .................................. 2013-026340

(51) Int. Cl.
*H05K 1/18* (2006.01)
*H05K 3/46* (2006.01)
(Continued)

(52) U.S. Cl.
CPC .............. *H05K 1/183* (2013.01); *H05K 1/028* (2013.01); *H05K 1/0271* (2013.01);
(Continued)

(58) Field of Classification Search
CPC ...... H05K 1/183; H05K 1/0271; H05K 1/028; H05K 3/4644
See application file for complete search history.

(56) References Cited

U.S. PATENT DOCUMENTS 3,612,745 A * 10/1971 Warren ................... B32B 17/10
174/254
5,950,305 A * 9/1999 Roberts .................. H05K 3/045
29/825
(Continued)

FOREIGN PATENT DOCUMENTS

JP 10-200217 A 7/1998
JP 2002-171030 A 6/2002
(Continued)

OTHER PUBLICATIONS

Official Communication issued in International Patent Application No. PCT/JP2014/050348, mailed on Mar. 11, 2014.

*Primary Examiner* — William H Mayo, III
*Assistant Examiner* — Hiram E Gonzalez
(74) *Attorney, Agent, or Firm* — Keating & Bennett, LLP

(57) ABSTRACT

A circuit board includes a main portion obtained by stacking a plurality of base sheets made of a flexible material in a predetermined direction and bonding the base sheets under pressure, and at least one planar conductor pattern provided in the main portion and including a concave portion and a convex portion. The concave portion and the convex portion extend in a direction perpendicular or substantially perpendicular to the predetermined direction. The concave portion is sunken in a direction parallel or substantially parallel to the predetermined direction. The convex portion protrudes in an opposite direction to the direction in which the concave portion is sunken. The at least one planar conductor pattern includes a first planar conductor pattern with a concave portion and a convex portion extending in a first direction. The circuit board further includes a plurality of first auxiliary members provided on one principal surface of the first planar conductor pattern and extending in the first direction,
(Continued)

the first auxiliary members being spaced apart in a third direction different from the first direction.

18 Claims, 14 Drawing Sheets

(51) Int. Cl.
  *H05K 3/10* (2006.01)
  *H05K 1/02* (2006.01)
  *H05K 1/03* (2006.01)
  *H05K 3/36* (2006.01)

(52) U.S. Cl.
  CPC ........... *H05K 1/0306* (2013.01); *H05K 1/181* (2013.01); *H05K 3/10* (2013.01); *H05K 3/4635* (2013.01); *H05K 3/4644* (2013.01); *H05K 1/0243* (2013.01); *H05K 1/185* (2013.01); *H05K 3/366* (2013.01); *H05K 3/4623* (2013.01); *H05K 2201/0141* (2013.01); *H05K 2201/0154* (2013.01); *H05K 2201/09245* (2013.01); *H05K 2201/09672* (2013.01); *H05K 2201/1003* (2013.01); *H05K 2201/10015* (2013.01); *H05K 2201/10098* (2013.01); *H05K 2203/06* (2013.01); *Y10T 29/49155* (2015.01)

(56) References Cited

U.S. PATENT DOCUMENTS

| | | | |
|---|---|---|---|
| 2007/0116932 A1* | 5/2007 | Van Der Tempel | G02F 1/133305 428/172 |
| 2011/0024160 A1* | 2/2011 | Quan | H05K 1/024 174/254 |
| 2012/0181068 A1 | 7/2012 | Kato et al. | |
| 2012/0188734 A1* | 7/2012 | Mikado | H05K 1/185 361/761 |
| 2015/0289378 A1* | 10/2015 | Jung | B32B 15/04 174/250 |

FOREIGN PATENT DOCUMENTS

| | | |
|---|---|---|
| JP | 2009-004709 A | 1/2009 |
| JP | 2010-062180 A | 3/2010 |
| WO | 2011/040393 A1 | 4/2011 |

* cited by examiner

FIG. 7
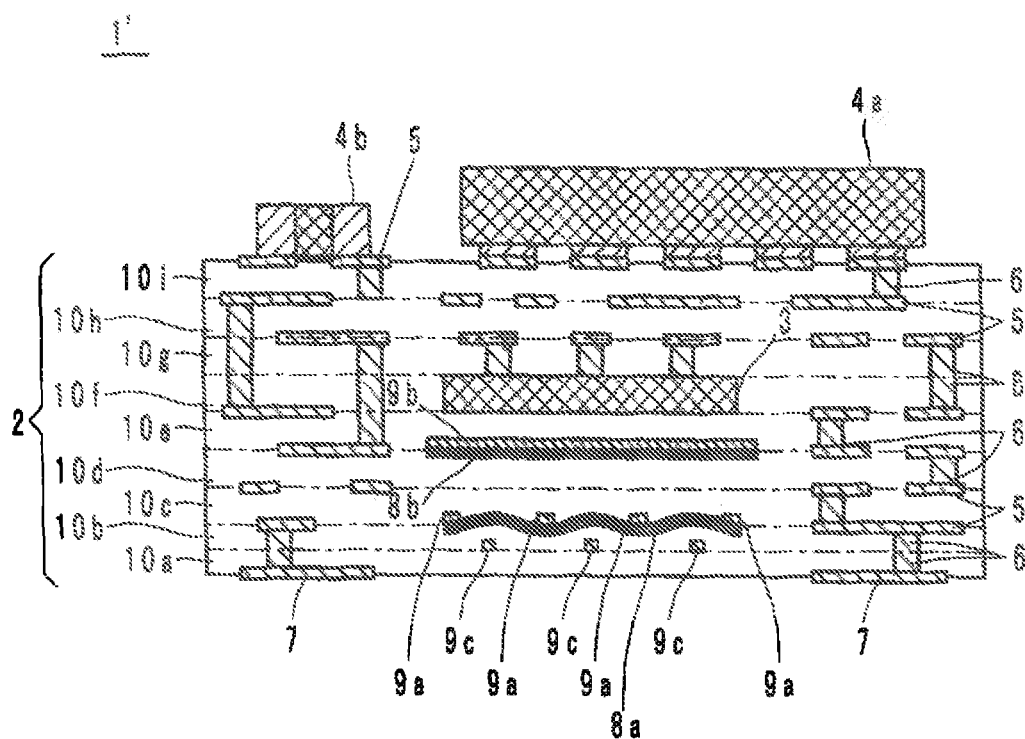
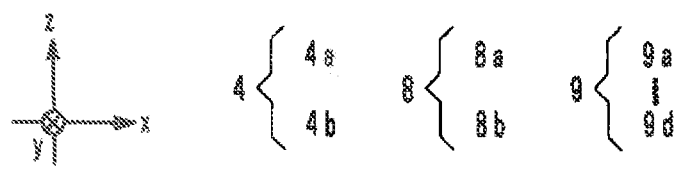

CIRCUIT BOARD AND METHOD FOR PRODUCING SAME

This application is based on Japanese Patent Application No. 2013-026340 filed on Feb. 14, 2013, and International Application No. PCT/JP2014/050348 filed on Jan. 10, 2014, the entire content of each of which is incorporated herein by reference.

BACKGROUND OF THE INVENTION

1. Field of the Invention

The present invention relates to a circuit board including a first portion relatively resistant to deformation and a second portion more flexible and less resistant to deformation than the first portion, and also relates to a method for producing the same.

2. Description of the Related Art

An example of a conventional circuit board of this type is described in International Publication No. WO 2011/040393. In International Publication No. WO 2011/040393, the circuit board includes a main portion obtained by stacking base sheets made of a flexible material (e.g., polyimide or liquid crystal polymer). The main portion includes a first portion relatively resistant to deformation and a second portion more flexible and less resistant to deformation than the first portion. The main portion has provided therein wiring conductors for electrically connecting an electronic component and various electrodes and reinforcing insulation films made of a more rigid material (e.g., epoxy resin) than the base sheets. The first portion is formed by providing the reinforcing insulation films so as to, when viewed in a plan view in the stacking direction of the base sheets, cover areas where the base sheets are not desired to be deformed.

The above conventional circuit board uses the reinforcing insulation films to form the first portion. However, if the reinforcing insulation films increase in area, the characteristics of the main portion greatly depend on the reinforcing insulation films, and therefore, the characteristics of the base sheets (such as low relative permittivity, low loss, and low water absorption) cannot be fully utilized. Moreover, the reinforcing insulation films are relatively large in area, and do not stick to the base sheets well, so that the bonding strength between the sheets might be insufficient.

SUMMARY OF THE INVENTION

One aspect of various preferred embodiments of the present invention is directed to a circuit board including a main portion obtained by stacking a plurality of base sheets made of a flexible material in a predetermined direction and bonding the base sheets under pressure, and at least one planar conductor pattern provided in the main portion and including a concave portion and a convex portion. The concave portion and the convex portion extend in a direction perpendicular or substantially perpendicular to the predetermined direction. The concave portion is sunken in a direction parallel or substantially parallel to the predetermined direction. The convex portion protrudes in an opposite direction to the direction in which the concave portion is sunken. The at least one planar conductor pattern includes a first planar conductor pattern with a concave portion and a convex portion extending in a first direction. The circuit board further includes a plurality of first auxiliary members provided on one principal surface of the first planar conductor pattern and extending in the first direction, the first auxiliary members being spaced apart in a third direction different from the first direction.

Another aspect of various preferred embodiments of the present invention is directed to a method for producing a circuit board, including the steps of preparing a plurality of base sheets made of a flexible material; forming a planar conductor pattern on at least one of the base sheets; and stacking the base sheets in a predetermined direction and bonding the base sheets under pressure, such that a concave portion and a convex portion extending in a direction perpendicular or substantially perpendicular to the predetermined direction are formed on the planar conductor pattern. The concave portion is sunken in a direction parallel or substantially parallel to the predetermined direction. The convex portion protrudes in an opposite direction to the direction in which the concave portion is sunken. The at least one planar conductor pattern includes a first planar conductor pattern with a concave portion and a convex portion extending in a first direction. The method further includes the step of forming a plurality of first auxiliary members provided on one principal surface of the first planar conductor pattern and extending in the first direction, the first auxiliary members being spaced apart in a third direction different from the first direction.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 7 is a vertical cross-sectional view of a circuit board according to a first modification of a preferred embodiment of the present invention.

DETAILED DESCRIPTION OF THE PREFERRED EMBODIMENTS

First, x-, y-, and z-axes in the figures will be described. The x-, y-, and z-axes are perpendicular or substantially perpendicular to one another. The z-axis represents a stacking direction of base sheets. For the sake of convenience, the positive and negative sides of the z-axis are defined as the top and bottom sides, respectively. Moreover, the x-axis indicates the left to right direction of the base sheets. More specifically, the positive and negative sides of the x-axis are defined as the right and left sides, respectively. Furthermore, the y-axis indicates the rear to forward direction of the base sheets. More specifically, the positive and negative sides of the y-axis are defined as the back and front sides, respectively.

Figure 1:
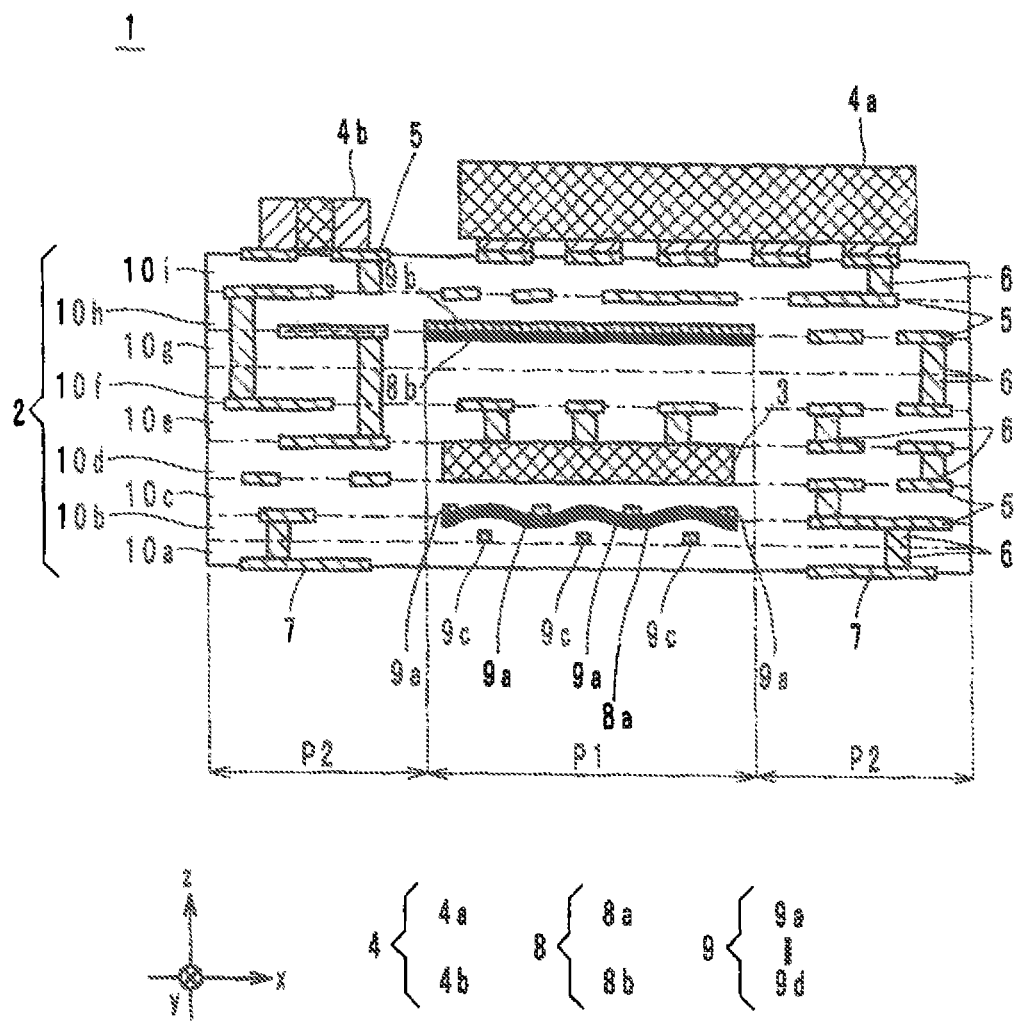
FIG. 1 is a vertical cross-sectional view of a circuit board according to a preferred embodiment of the present invention.
Figure 2:
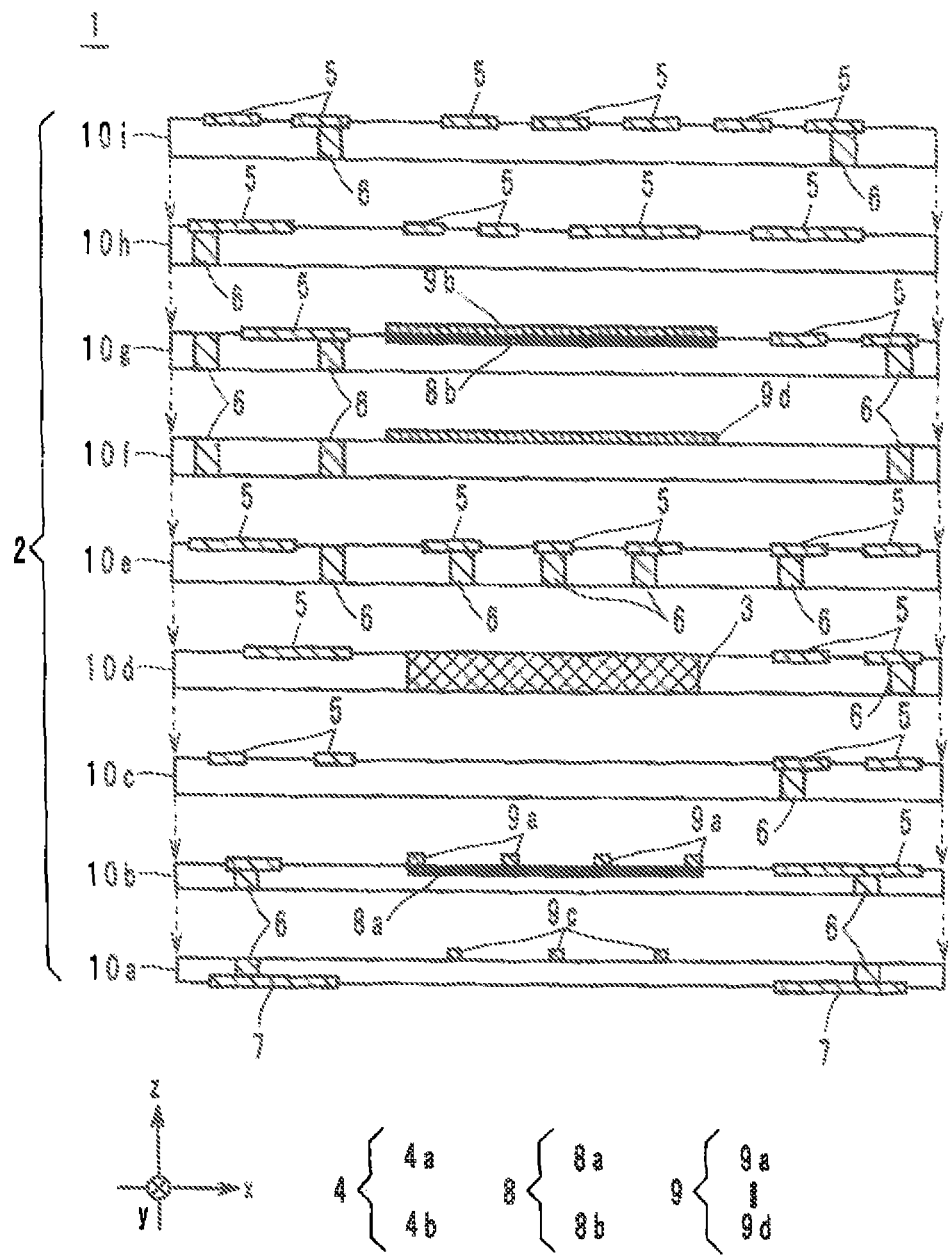
FIG. 2 is a view of the circuit board in FIG. 1 separated into its individual base sheets.

FIG. 1 is a view illustrating a vertical cross-section of a circuit board according to a preferred embodiment of the present invention. FIG. 2 is a view illustrating the circuit board 1 in FIG. 1 separated into its individual base sheets 10. In FIGS. 1 and 2, the circuit board 1 includes a main portion 2, at least one internal electronic component (referred to below as an internal component) 3, at least one surface-mount electronic component (referred to below as a surface-mount component) 4, a plurality of pattern conductors 5, a plurality of via-conductors 6, and a plurality of external electrodes 7.

The main portion 2 is a stack of thermoplastic base sheets 10 (in the figures, first through nine base sheets 10a to 10i are shown) having been bonded under pressure. Here, in FIG. 1, the interface between every two base sheets 10 are indicated by an imaginary long-dashed short-dashed line. The base sheets 10 are made of a flexible material which provides electrical insulation (e.g., a thermoplastic resin such as polyimide or liquid crystal polymer). Polyimide and liquid crystal polymer are particularly preferable as materials for the base sheets 10 because they offer a low relative permittivity, a low loss, and low water absorption. Moreover, the base sheets 10 preferably have the same rectangular or substantially rectangular shape when viewed in a plan view from the positive side of the z-axis, and also have a thickness of at least about 10 μm, for example.

The base sheet 10a is the closest to a mother board (not shown) when the circuit board 1 is mounted thereon. The external electrodes 7 are formed of a conductive material, such as copper, on the bottom surface of the base sheet 10a so as to correspond to the positions of land electrodes on the mother board.

Furthermore, the via-conductors 6 are provided in the base sheet 10a. The via-conductors 6 are made of a conductive material such as an alloy of tin and silver. The via-conductors 6 electrically connect an electronic circuit, which includes the internal component 3 and the surface-mount component 4, to the mother board. The via-conductors 6 pierce through the base sheets 10 in the z-axis direction. Note that in FIG. 1, to avoid complexities of the figure, the reference numeral "6" is assigned only to some of the via-conductors.

The base sheets 10b to 10h are stacked respectively on their corresponding upper principal surfaces of the base sheets 10a to 10g. The pattern conductors 5 are formed of a conductive material, such as copper, on the upper principal surfaces of the base sheets 10b to 10h. More specifically, the pattern conductors 5 are formed of a conductive material mainly composed of copper or silver and having a low specific resistance, by patterning a conductor film firmly fixed to a large-sized base sheet. Here, the conductor film is metal foil attached to one side of the base sheet, for example. The pattern conductors 5 define and serve as wiring conductors of the electronic circuit, including the internal component 3 and the surface-mount component 4, and also define and serve as electrodes of capacitors and inductors included in the electronic circuit. Each pattern conductor 5 is electrically connected to, for example, another pattern conductor formed on a different base sheet 10 through at least one via-conductor 6. Note that to avoid complexities of FIG. 1, the reference numeral "5" is assigned only to some of the pattern conductors.

Furthermore, when viewed in a plan view in the z-axis direction (referred to below as "in a top view"), a cavity is provided at or around the center of the base sheet 10d in order to accommodate the internal component 3 to be described later.

Moreover, the base sheet 10i is stacked on the upper principal surface of the base sheet 10h. On the upper principal surface of the base sheet 10i, a plurality of land electrodes configured to mount the surface-mount component 4 are defined by pattern conductors 5. In addition, the base sheet 10i has some via-conductors 6 provided therein. These via-conductors 6 are directly below the land electrodes on the base sheet 10i so as to pierce through the base sheet 10i in the z-axis direction.

The internal component 3 is preferably an IC chip. An example of an IC chip of this type is a secure IC chip incorporating an EEPROM and configured to store various types of information.

The surface-mount component 4 preferably is, for example, an IC chip or a passive component. An example of an IC chip of this type is an RF IC chip 4a for use in 13.56-MHz band NFC (Near Field Communication). Another example of the surface-mount component 4 is a chip capacitor 4b configured to define a resonant circuit along with an antenna coil included in the RF IC chip 4a. The surface-mount component 4 is mounted on the land electrodes on the upper principal surface of the base sheet 10i using a conductive, bonding material such as solder.

Here, to prevent the internal component 3 from cracking and also to ensure reliable joints between the internal component 3 and the via-conductors 6, etc., it is preferable that the main portion 2 be relatively resistant to deformation in portions above and below the internal component 3. From this viewpoint, in addition to including the foregoing, the circuit board 1 includes at least one planar conductor pattern 8 and at least one set of auxiliary members 9.

In the present preferred embodiment, the circuit board 1 includes two planar conductor patterns 8, i.e., first and second planar conductor patterns 8a and 8b, which are positioned above and below the internal component 3 so as to be opposite to each other with the internal component 3 positioned therebetween. The planar conductor patterns 8a and 8b are preferably made of the same conductive material as the pattern conductors 5. However, this is not limiting, and the planar conductor patterns 8a and 8b may be made of another conductive material.

Figure 3:
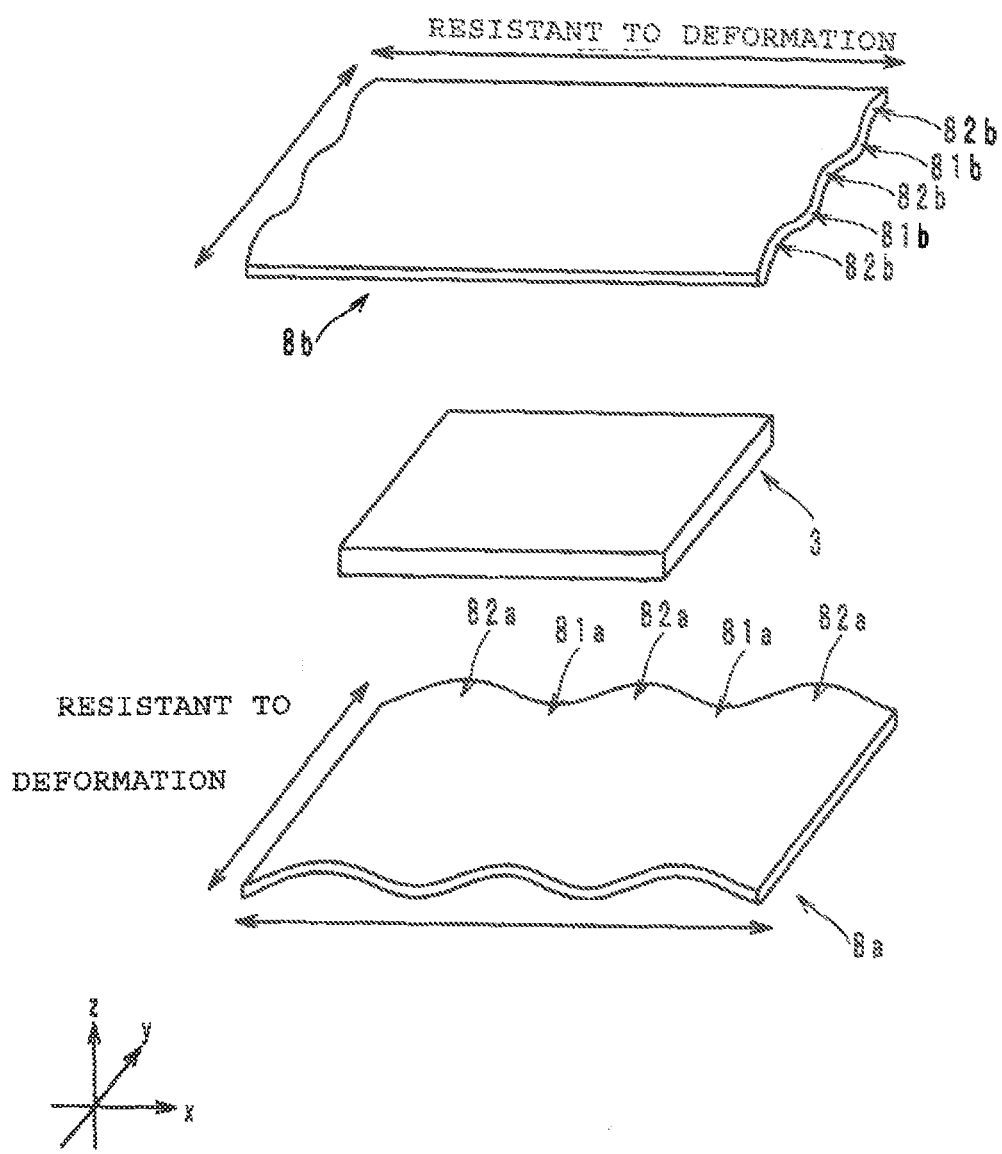
FIG. 3 is an oblique view schematically illustrating first and second planar conductor patterns (after compression bonding) and an electronic component shown in FIG. 1.

The planar conductor pattern 8a is provided between the base sheets 10b and 10c, and for example, the planar conductor pattern 8a has such a size that the outline of the internal component 3 is kept within the limits of the planar conductor pattern 8a when viewed in a top view. In addition, the planar conductor pattern 8a has approximately the same thickness as the pattern conductors 5. Further, the planar conductor pattern 8a has a wave-shaped configuration when viewed in a plan view in the y-axis direction. More specifically, the planar conductor pattern 8a typically includes a plurality of concave portions 81a and a plurality of convex portions 82a, both of which extend in the y-axis direction, as shown in FIG. 3. More specifically, the concave portions 81a are sunken toward the negative end of the z-axis direction, and the convex portions 82a protrude toward the positive end of the z-axis direction (i.e., in the opposite direction to the direction toward which the concave portions 81a are sunken). Moreover, the planar conductor pattern 8a is configured such that the concave portions 81a and the convex portions 82a alternate with each other in the x-axis direction.

The planar conductor pattern 8b is provided between the base sheets 10g and 10h, and for example, the planar conductor pattern 8b has such a size that the outline of the internal component 3 is kept within the limits of the planar conductor pattern 8b when viewed in a top view. In addition, the planar conductor pattern 8b has the same or approximately the same thickness as the pattern conductors 5. Further, the planar conductor pattern 8b has a wave-shaped configuration when viewed in a plan view in the x-axis direction. More specifically, the planar conductor pattern 8b typically includes a plurality of concave portions 81b and a plurality of convex portions 82b, both of which extend in the x-axis direction, as shown in FIG. 3. More specifically, the concave portions 81b are sunken toward the negative end of the z-axis direction, and the convex portions 82b protrude toward the positive end of the z-axis direction (i.e., in the opposite direction to the direction toward which the concave portions 81b are sunken). Moreover, the planar conductor pattern 8b is configured such that the concave portions 81b and the convex portions 82b alternate with each other in the y-axis direction.

The planar conductor patterns 8a and 8b as described above are preferably used as ground conductors for the aforementioned electronic circuit. Aside from this, the planar conductor patterns 8a and 8b may be used as electrodes which define and serve as capacitors for the electronic circuit or may be used as so-called dummy conductors, which are not included in the circuit as working components thereof.

Figure 4:
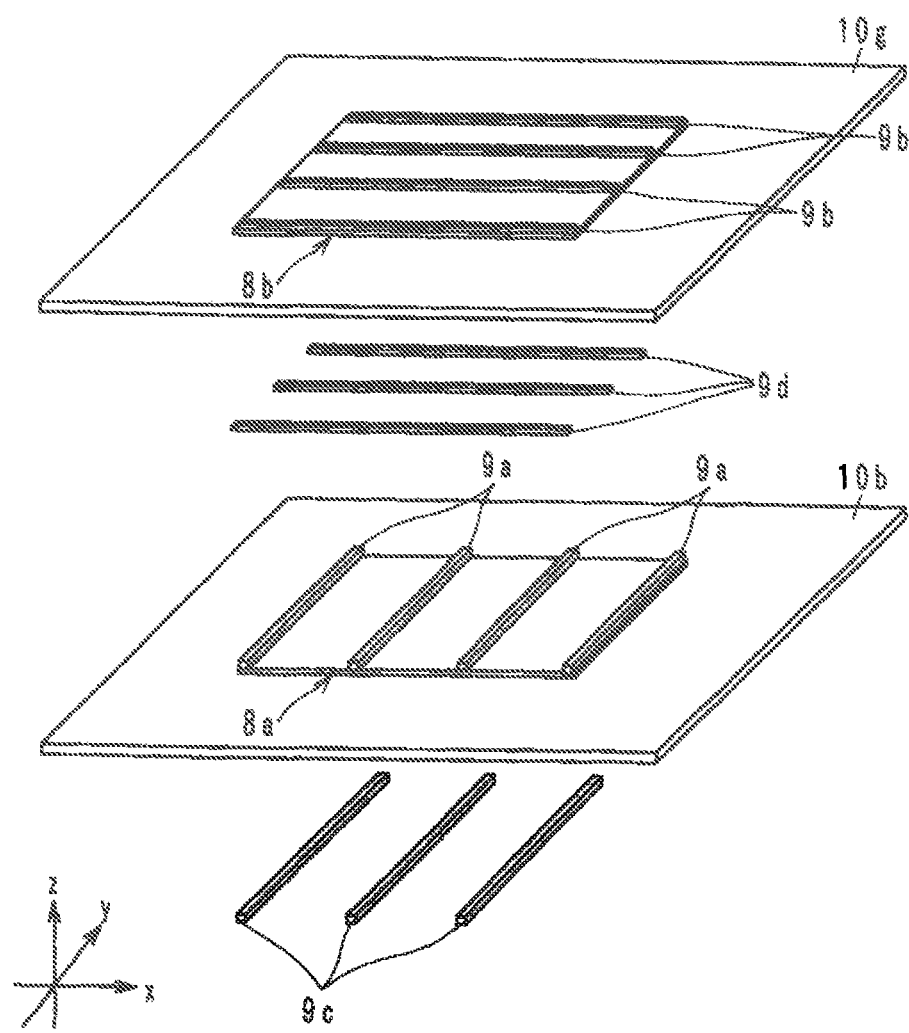
FIG. 4 is an oblique view schematically illustrating the first and second planar conductor patterns (before compression bonding) and auxiliary members.

The circuit board 1 exemplarily includes four sets of auxiliary members 9, i.e., first through fourth sets of auxiliary members 9a to 9d, as shown in, for example, FIG. 4. The auxiliary members 9a to 9d are made of a material having properties of being neither softened nor fluidized at the time of compression bonding of the base sheets 10. An example of such a material is a thermosetting resin such as epoxy. However, this is not limiting, and the auxiliary members 9a to 9d may be made of the same material as, for example, the planar conductor pattern 8a so long as the aforementioned properties are acquired. Aside from this, the auxiliary members 9a to 9d may be made of the same flexible material (e.g., liquid crystal polymer) as the base sheets 10 so long as the material has a softening point such that it is not softened at the time of compression bonding of the base sheets 10.

The auxiliary members 9a and 9c are configured to provide the planar conductor pattern 8a with the wave-shaped configuration at the time of compression bonding of the base sheets 10.

The auxiliary members 9a are preferably strip-shaped sheet members provided on the upper principal surface of the planar conductor pattern 8a prior to compression bonding. The width of each sheet member in the x-axis direction preferably is about 20 µm to about 500 µm, for example, which is considerably narrower than the width of the planar conductor pattern 8a. In addition, the thickness of the sheet member in the z-axis direction preferably is about 5 µm to about 100 µm, for example. Further, the length of the sheet member in the y-axis direction is preferably the same or approximately the same as the length of the planar conductor pattern 8a. The sheet members extend in the y-axis direction and are spaced apart in the x-axis direction.

Furthermore, the auxiliary members 9c preferably are strip-shaped sheet members provided on the upper principal surface of the base sheet 10a prior to compression bonding. The sheet members have approximately the same size as the sheet members that serve as the auxiliary members 9a. In addition, the auxiliary members 9c extend in the y-axis direction and are spaced apart in the x-axis direction so as not to overlap with the auxiliary members 9a when viewed in a plan view in the z-axis direction.

The auxiliary members 9b and 9d are members that define the wave-shaped configuration of the planar conductor pattern 8b at the time of compression bonding of the base sheets 10.

The auxiliary members 9b are strip-shaped sheet members provided on the upper principal surface of the planar conductor pattern 8b prior to compression bonding. The width of each sheet member in the y-axis direction is preferably about 20 µm to about 500 µm, for example, which is considerably narrower than the width of the planar conductor pattern 8b. In addition, the thickness of the sheet member in the z-axis direction preferably is about 5 µm to about 100 µm, for example. Further, the length of the sheet member in the x-axis direction is preferably the same or approximately the same as the length of the planar conductor pattern 8b. The sheet members extend in the x-axis direction and are spaced apart in the y-axis direction.

Furthermore, the auxiliary members 9d are strip-shaped sheet members provided on the upper principal surface of the base sheet 10f prior to compression bonding. The sheet members preferably have the same or approximately the same size as the sheet members that define and serve as the auxiliary members 9b. In addition, the auxiliary members 9d extend in the x-axis direction and are spaced apart in the y-axis direction so as not to overlap with the auxiliary members 9b when viewed in a plan view in the z-axis direction.

Next, a non-limiting example of a method for producing the circuit board 1 will be described with reference to FIGS. 5A to 5D. In the following, the process of producing one circuit board 1 will be described, but in actuality, large-sized base sheets are stacked and cut, thereby simultaneously producing a large number of circuit boards 1.

Prepared first are a number of large-sized base sheets with their top surfaces copper-foiled almost entirely. The large-sized base sheets define and serve as base sheets 10 upon completion of a circuit board 1. To produce the circuit board 1 shown in FIG. 1, large-sized base sheets 11a to 11i (see FIG. 5A) corresponding to the base sheets 10a to 10i are prepared. The base sheets 11a to 11i are sheets of liquid crystal polymer, each having a thickness of, for example, from about 10 µm to about 100 µm. The thickness of the copper foil is, for example, is about 3 µm to about 30 µm. Note that the copper-foiled surfaces are preferably smoothened, for example, by galvanization for rust prevention.

Figure 5A:
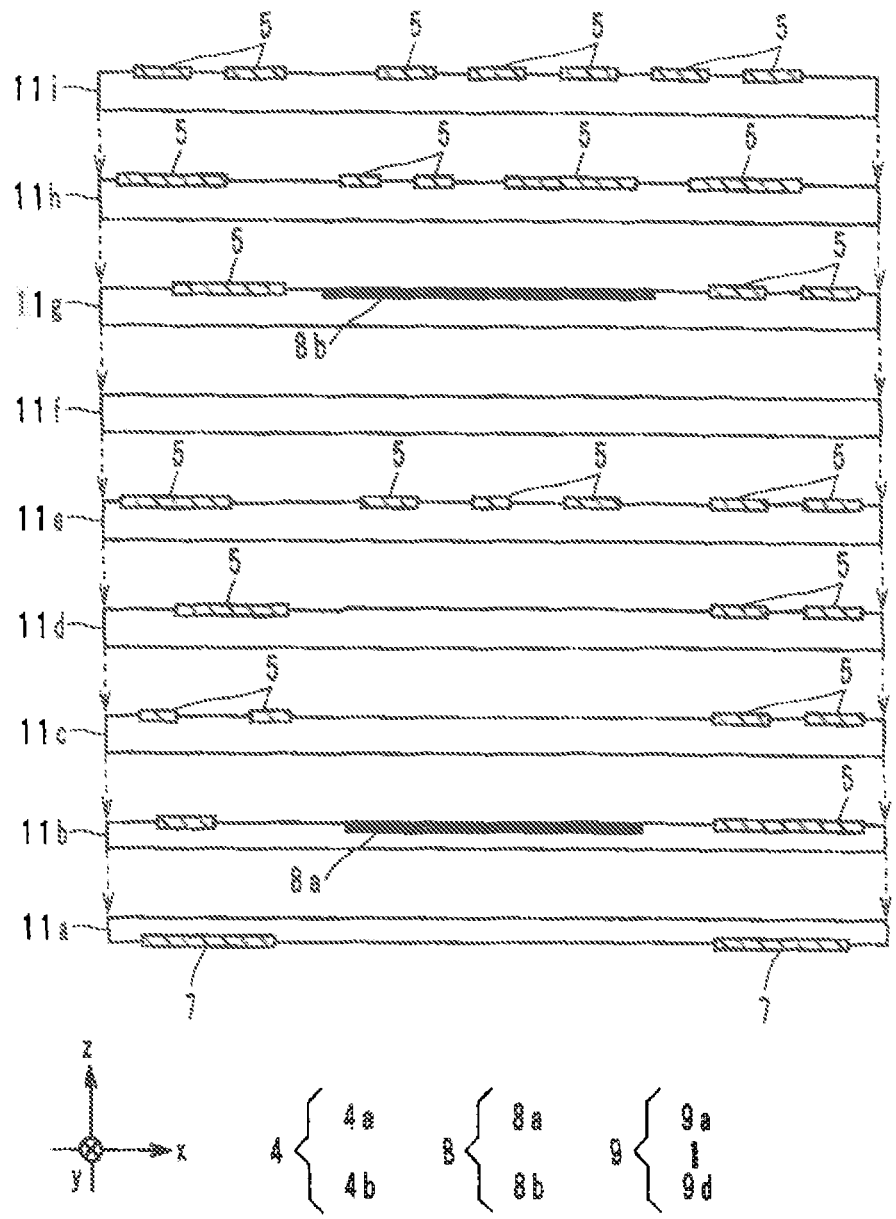
FIG. 5A is a diagram illustrating the first step of a method for producing the circuit board shown in FIG. 1.
Figure 5B:
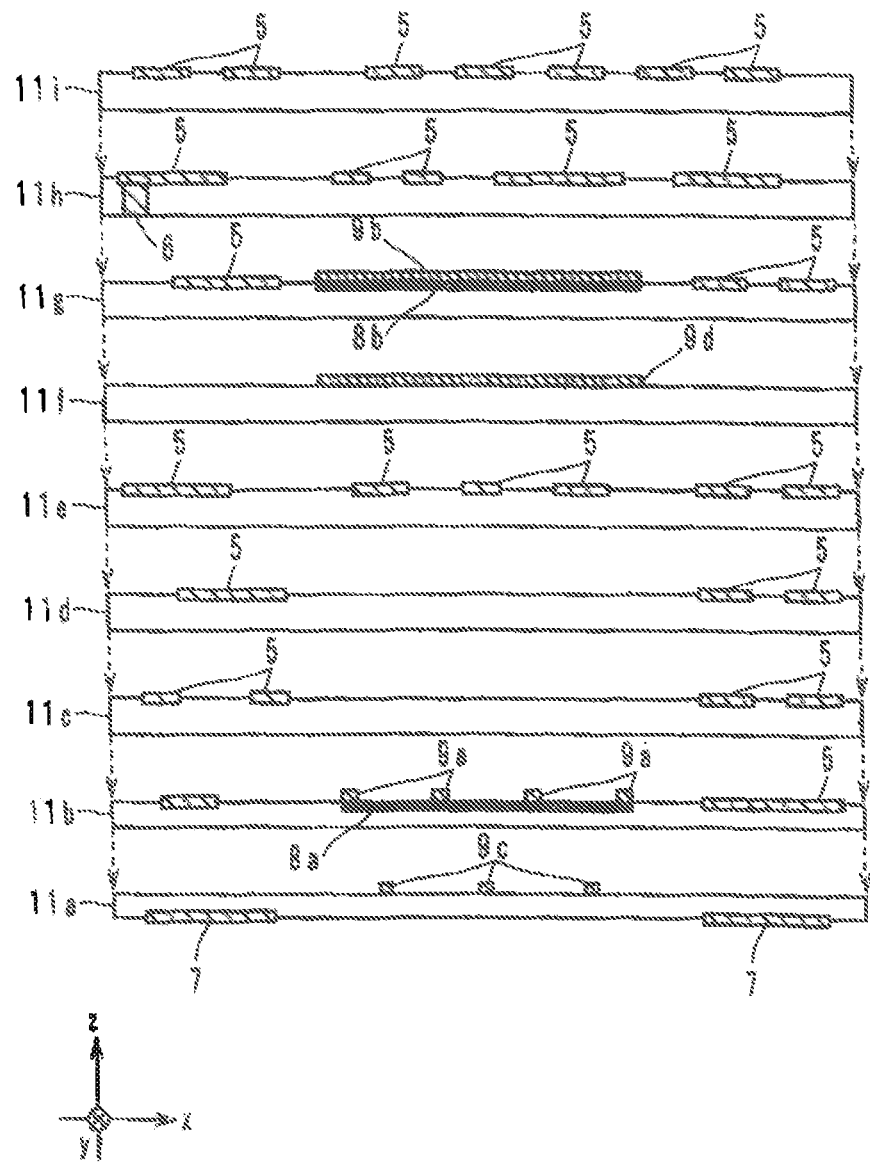
FIG. 5B is a diagram illustrating a subsequent step to FIG. 5A.

Next, as shown in FIG. 5A, a plurality of external electrodes 7 are formed on one principal surface (in FIG. 5A, the lower principal surface) of the base sheet 11a by patterning the copper foil on that principal surface. Similarly, pattern conductors 5 (i.e., flat conductor patterns constituting wiring conductors or serving as various electrodes) are formed on one principal surface (in FIG. 5A, the upper principal surface) of each of the base sheets 11*b* to 11*e* and 11*g* to 11*i*. At this time, planar conductor patterns 8*a* and 8*b* are formed on the base sheets 11*b* and 11*g*, respectively.

Next, auxiliary members 9*c* are formed by printing on one principal surface (in FIG. 5B, the upper principal surface) of the base sheet 11*a* using a resin paste such as epoxy resin. Similarly, auxiliary members 9*a*, 9*b*, and 9*d* are formed by printing on one principal surface of each of their respective base sheets 11*b*, 11*g*, and 11*f*.

Figure 5C:
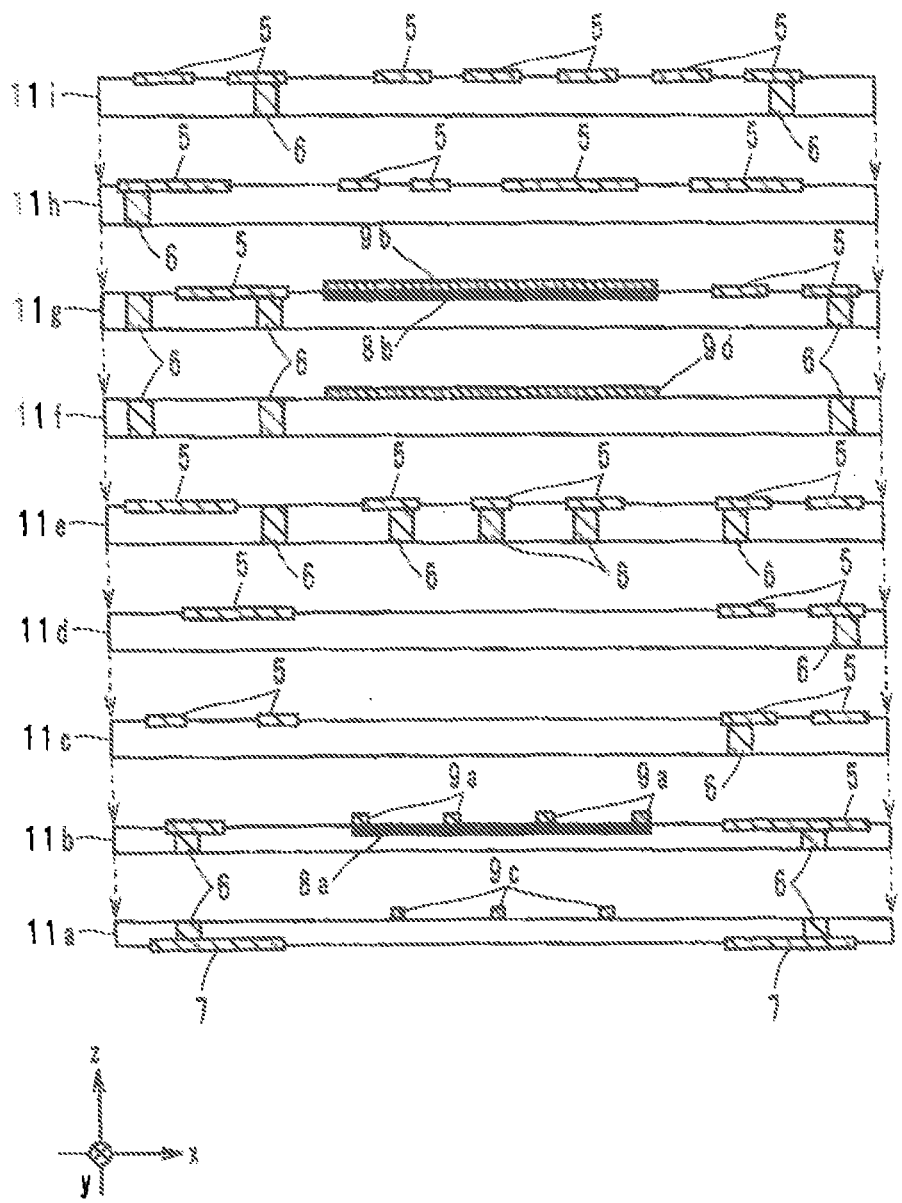
FIG. 5C is a diagram illustrating a subsequent step to FIG. 5B.
Figure 5D:
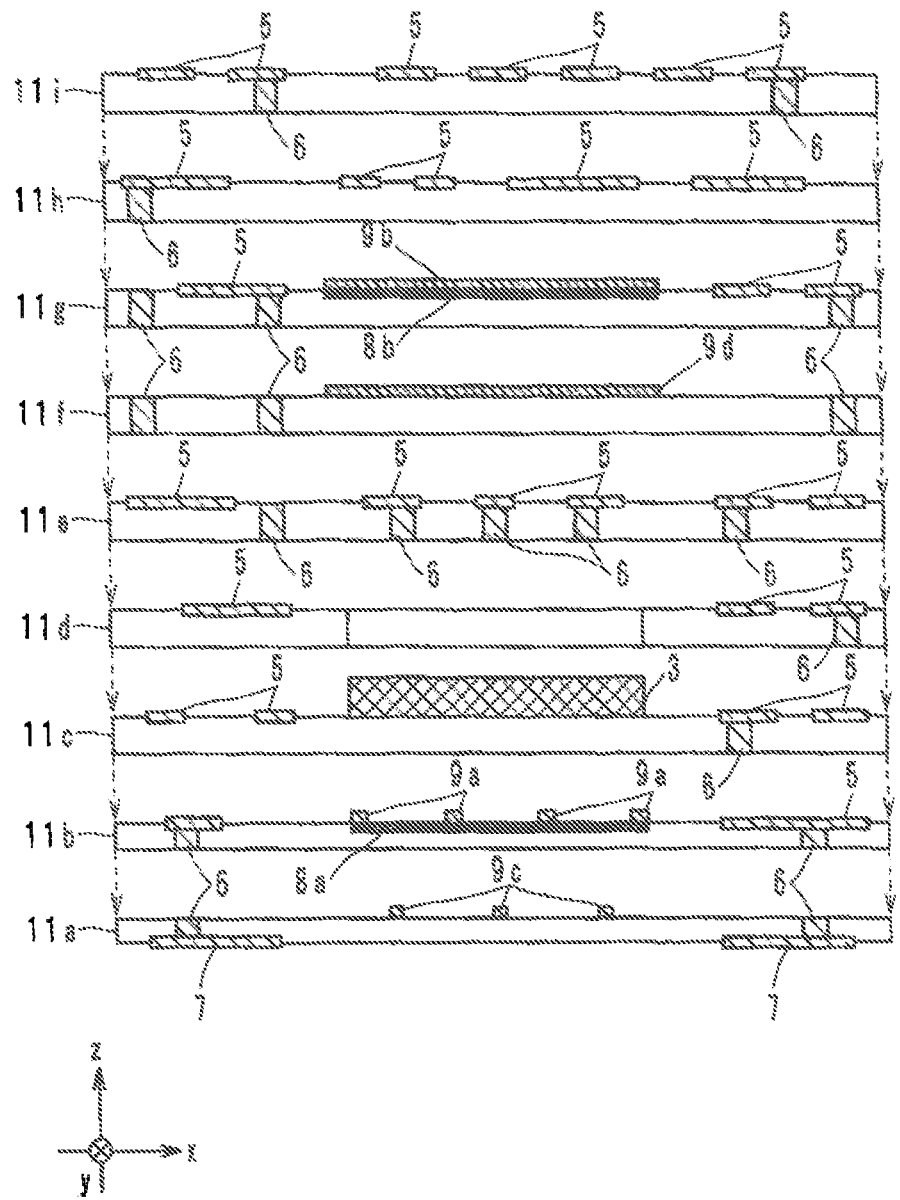
FIG. 5D is a diagram illustrating a subsequent step to FIG. 5C.

Next, the base sheet 11*a* is irradiated with laser beams in positions where via-conductors 6 are to be formed, as shown in FIG. 5C, on the side without the external electrodes 7 (in FIG. 5C, on the top side). As a result, through-holes are provided so as to pierce through the base sheet 11*a* but not through the external electrodes 7, and thereafter, each through-hole is filled with a conductive paste.

Similarly, the base sheet lib is irradiated with laser beams in positions where via-conductors 6 are to be formed, on the side without the pattern conductors 5 (in FIG. 5C, on the bottom side). Each of the resultant through-holes is filled with a conductive paste. Likewise, through-holes are provided in predetermined positions in the base sheets 11*c* to 11*i*, and thereafter, each through-hole is filled with a conductive paste.

Next, an internal component 3 is placed in a predetermined position on one principal surface (in FIG. 5D, the upper principal surface) of the base sheet 11*c*. Moreover, a predetermined area of the base sheet 11*d* is punched out using a punching die, such that a through-hole to serve as a cavity is provided.

Next, the base sheets 11*a* to 11*i* are stacked in this order from bottom to top. Here, the base sheet 11*a* is placed such that the surface with the external electrodes 7 faces down, and the base sheets 11*b* to 11*i* are stacked such that the surfaces with the pattern conductors 5 face up.

Thereafter, the stacked base sheets 11*a* to 11*i* are heated and pressed from both sides in the z-axis direction. The heating and the pressing soften and bond the base sheets 11*a* to 11*i*, thus integrating them. At the same time, the conductive paste in each via-hole is sintered so that via-conductors 6 are formed as interlayer-connection conductor patterns.

Here, in the stacked base sheets 11*a* to 11*i*, the auxiliary members 9*a* are located on the upper principal surface of the planar conductor pattern 8*a*, and the auxiliary members 9*c* are located below the planar conductor pattern 8*a*. Moreover, the auxiliary members 9*b* are located on the upper principal surface of the planar conductor pattern 8*b*, and the auxiliary members 9*d* are located below the planar conductor pattern 8*b*. The auxiliary members 9*a* to 9*d* are neither softened nor fluidized by heat and pressure applied at the time of compression bonding. Accordingly, the planar conductor pattern 8*a* receives a downward force along the z-axis from each auxiliary member 9*a*, as well as an upward force along the z-axis from each auxiliary member 9*c*. Moreover, each auxiliary member 9*c*, when viewed in a plan view in the z-axis direction, is positioned between two adjacent auxiliary members 9*a* in the x-axis direction. Therefore, as described earlier, the planar conductor pattern 8*a* is changed into a wave-shaped configuration when viewed in a plan view in the y-axis direction. Likewise, the planar conductor pattern 8*b* is similarly changed into a wave-shaped configuration when viewed in a plan view in the x-axis direction.

After the compression bonding process as described above, a surface-mount component 4 is mounted on land electrodes of the base sheet 11*i* by reflow soldering or other suitable material. Thereafter, the integrated base sheets 11*a* to 11*i* are cut into a predetermined size, such that a circuit board 1 as shown in FIG. 1 is completed.

As described above, in the present preferred embodiment, the planar conductor patterns 8*a* and 8*b* in the wave-shaped configuration are provided respectively below and above the internal component 3 within the main portion 2. Here, the planar conductor pattern 8*a* includes the concave portions 81*a* and the convex portions 82*a*, both of which extend along the y-axis. Accordingly, the planar conductor pattern 8*a* is resistant to bending by a bending moment that causes a turn about the x-axis (see FIG. 3). That is, the planar conductor pattern 8*a* has a high section modulus for a cross-section parallel or substantially parallel to the zx plane.

Furthermore, the planar conductor pattern 8*b* includes the concave portions 81*b* and the convex portions 82*b*, both of which extend along the x-axis. Accordingly, the planar conductor pattern 8*b* is resistant to bending by a bending moment that causes a turn about the y-axis (see FIG. 3).

Accordingly, the main portion 2 includes a first portion P1 relatively resistant to bending deformation, which includes areas inside and around the outline of the internal component 3 when viewed in a top view, as shown in FIG. 1. On the other hand, the main portion 2 includes a second portion P2 relatively less resistant to deformation, which includes areas other than the first portion P1.

Furthermore, the main portion 2 is made of a material, such as polyimide or liquid crystal polymer, which offers a low relative permittivity, a low loss, and low water absorption. Moreover, the main portion 2 has no constituent members made of a material, such as epoxy resin, which affects the relative permittivity, loss, and water absorption. Therefore, it is possible to provide a circuit board 1 capable of taking full advantage of the characteristics of the base sheets 10 (such as low relative permittivity, low loss, low water absorption, and adhesion between the base sheets), and it is also possible to provide a method for producing the same.

As described above, in some cases, the auxiliary members 9*a* to 9*d* might be composed of epoxy resin or other suitable material. However, even in such a case, the volume occupied by epoxy resin or other suitable material in the main portion 2 is small, and therefore, the epoxy resin or other suitable material barely affects the characteristics of the base sheets 10 (such as low relative permittivity, low loss, low water absorption, and adhesion between the base sheets). That is, even in this case, it is possible to provide a circuit board 1 capable of taking full advantage of the characteristics of the base sheets 10 (such as low relative permittivity, low loss, and low water absorption), and it is also possible to provide a method for producing the same.

Figure 6:
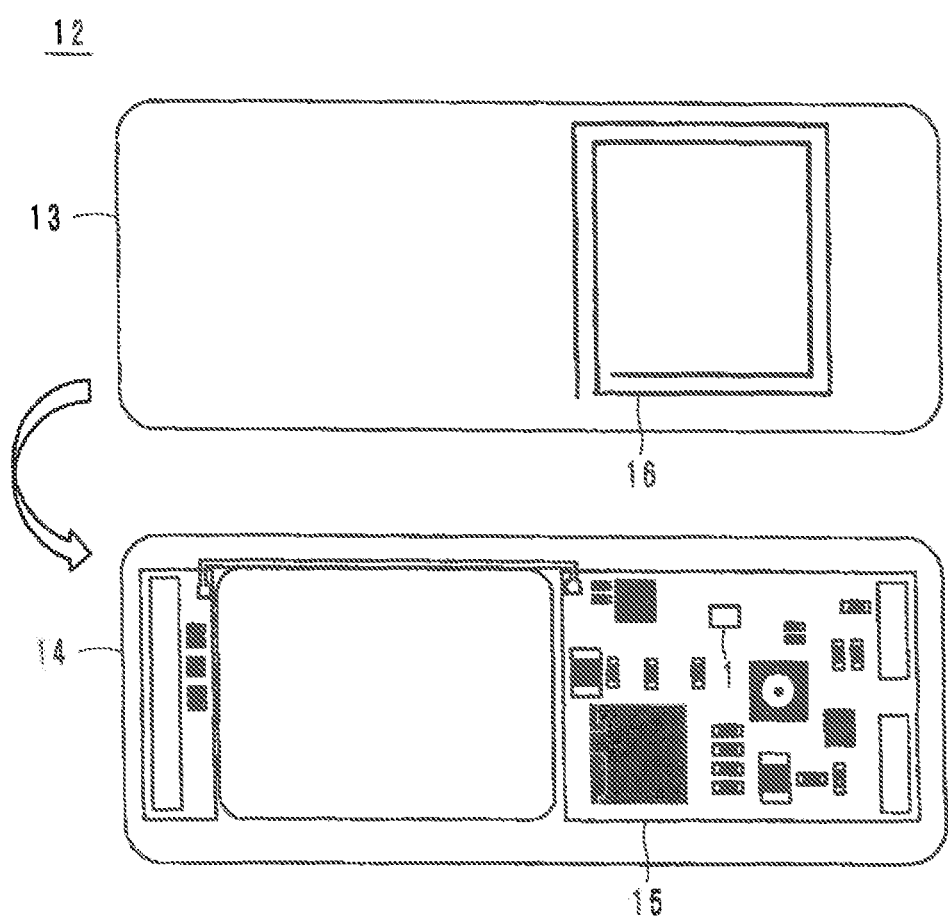
FIG. 6 is a diagram illustrating a communication terminal device to which the circuit board shown in FIG. 1 is applied.

FIG. 6 is a schematic diagram illustrating the configuration of a communication terminal device 12 to which the circuit board 1 in FIG. 1 is applied. In FIG. 6, the communication terminal device 12 preferably is configured to be capable of contactless communication by a 13.56-MHz band RFID (Radio Frequency Identification) system, for example. An example of such an RFID system is NFC (Near Field Communication).

FIG. 6 shows various components and members disposed in a housing 14 of the communication terminal device 12 with its housing cover 13 open. The communication terminal device 12 is typically a cell phone or a smartphone, and includes a printed wiring board 15, which has the circuit board 1 mounted thereon, and a booster antenna 16 within the housing 14. In addition to these, a battery pack, a camera, a UHF antenna, and various circuit elements are mounted and arranged in high density within the housing 14, but they are not indispensable features of a preferred embodiment of the present invention, and therefore, any descriptions thereof will be omitted.

Furthermore, the booster antenna 16 is attached to the housing cover 13 so as to be situated above an antenna coil of the surface-mount component 4a when the housing cover 13 is closed. The booster antenna 16 is, for example, a planar spiral coil or other suitable material, and is provided in order to extend the communication distance of the antenna coil.

The circuit board 1 has various components integrated, including the internal component 3 and the surface-mount component 4b (see FIG. 1). Accordingly, it is possible to reduce transmission loss and unnecessary electromagnetic coupling due to long wiring in the communication terminal device 12. Further, it is possible to downsize the space in which to mount the components.

While the foregoing has been described with respect to an application example to the 13.56-MHz band RFID system, this is not limiting, and aside from that, the circuit board 1 can also be applied to wireless communication systems using the UHF band, such as a wireless LAN.

First Modification

Figure 8:
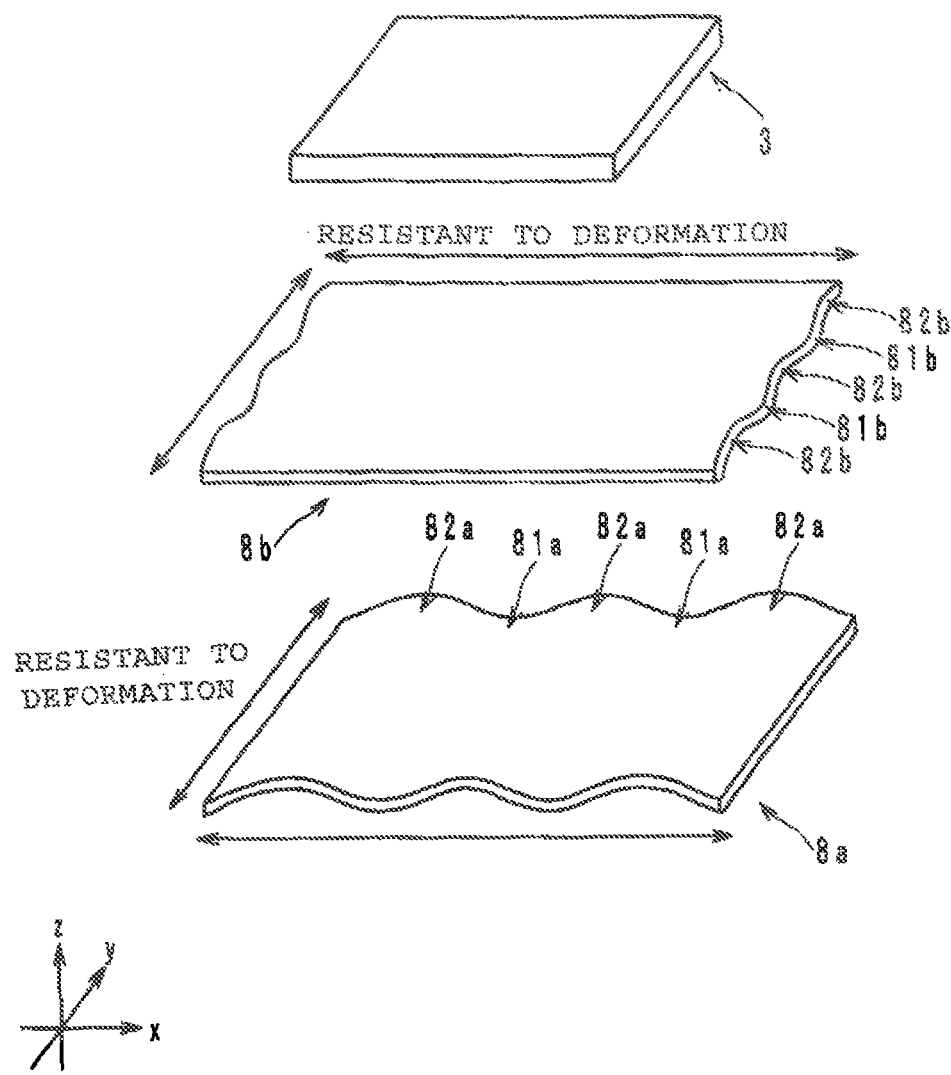
FIG. 8 is an oblique view schematically illustrating first and second planar conductor patterns (after compression bonding) and an electronic component shown in FIG. 7.

FIG. 7 is a vertical cross-sectional view of a circuit board 1' according to a first modification of a preferred embodiment of the present invention. FIG. 8 is an oblique view illustrating planar conductor patterns 8a and 8b and an internal component 3 of the circuit board 1' in FIG. 7. In FIGS. 7 and 8, the circuit board 1' differs from the circuit board 1 in that the planar conductor patterns 8a and 8b are provided on the negative side in the z-axis direction relative to the internal component 3. There are no other differences between the circuit boards 1 and 1'. Therefore, in FIGS. 7 and 8, the same components as those described in conjunction with the above preferred embodiment are denoted by the same reference numerals, and any descriptions thereof will be omitted.

Second Modification

Figure 9:
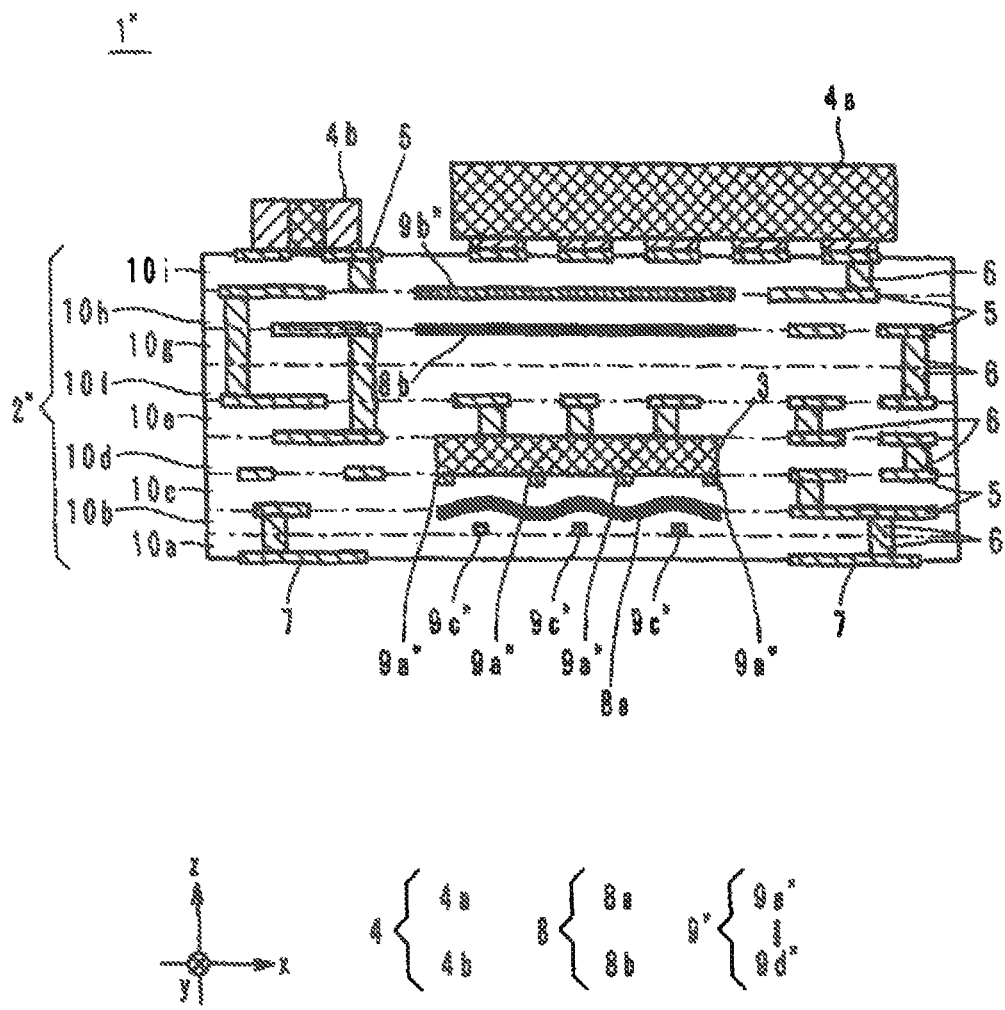
FIG. 9 is a vertical cross-sectional view of a circuit board according to a second modification of a preferred embodiment of the present invention.
Figure 10:
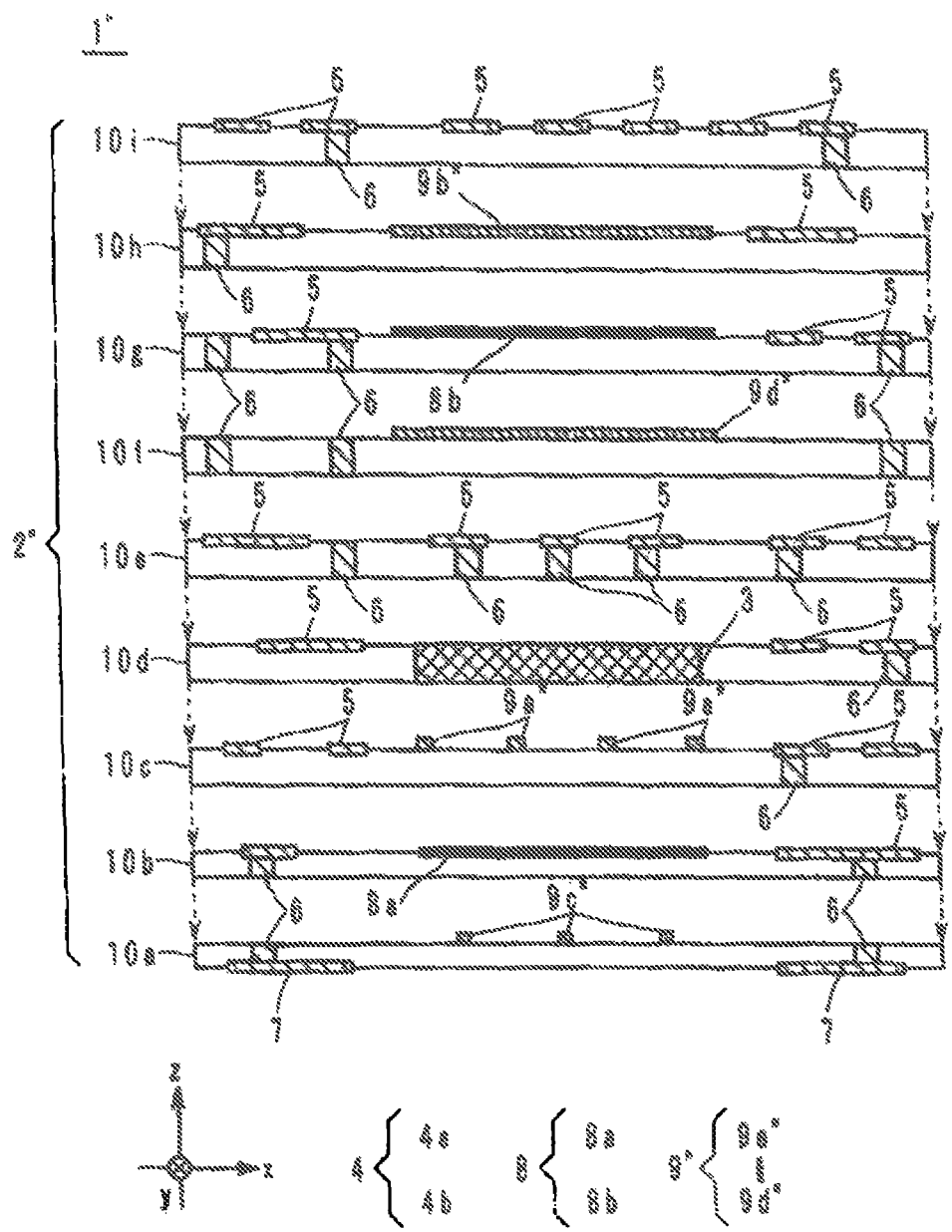
FIG. 10 is a view of the circuit board in FIG. 9 separated into its individual base sheets.
Figure 11:
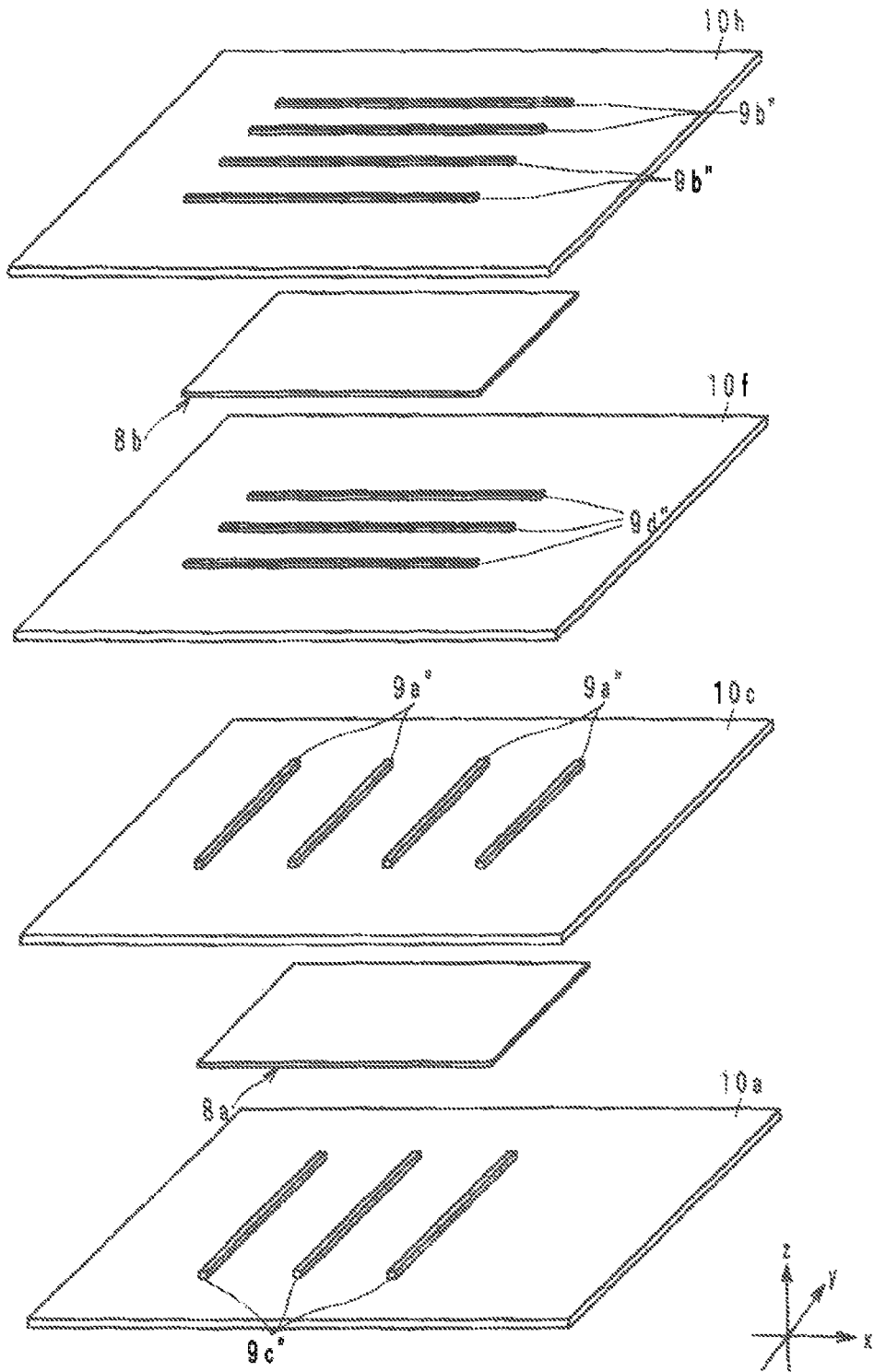
FIG. 11 is an oblique view schematically illustrating first and second planar conductor patterns (before compression bonding) and auxiliary members shown in FIG. 9.

FIG. 9 is a vertical cross-sectional view of a circuit board 1" according to a second modification of a preferred embodiment of the present invention. FIG. 10 is a view illustrating the circuit board 1" in FIG. 9 separated into its individual base sheets 10. FIG. 11 is an oblique view schematically illustrating planar conductor patterns 8a and 8b (before compression bonding) and auxiliary members 9a" to 9d" shown in FIG. 9.

In FIGS. 9 to 11, the circuit board 1" differs from the circuit board 1 in that a main portion 2" and the auxiliary members 9a" to 9d" are provided in place of the main portion 2 and the auxiliary members 9a to 9d. There are no other differences between the circuit boards 1 and 1". Therefore, in FIGS. 9 to 11, the same components as those described in conjunction with the above preferred embodiment are denoted by the same reference numerals, and any descriptions thereof will be omitted.

In the present modification, the auxiliary members 9a" to 9d" are made of a conductive material (e.g., copper) which has the characteristics of being neither softened nor fluidized at the time of compression bonding of the base sheets 10.

The auxiliary members 9a" and 9c" are members that configure the wave-shaped configuration of the planar conductor pattern 8a at the time of compression bonding of the base sheets 10.

The auxiliary members 9a" are strip-shaped sheet members provided on the upper principal surface of the base sheet 10c and having the same or essentially the same size as the auxiliary members 9a. The sheet members extend in the y-axis direction within the outline of the internal component 3 when viewed in a top view, and they are spaced apart in the x-axis direction.

Furthermore, the auxiliary members 9c" are strip-shaped sheet members provided on the upper principal surface of the base sheet 10a. The sheet members have the same or approximately the same size as the sheet members that serve as the auxiliary members 9a". The auxiliary members 9c" extend in the y-axis direction and are spaced apart in the x-axis direction so as not to overlap with the auxiliary members 9a" when viewed in a plan view in the z-axis direction.

The auxiliary members 9b" and 9d" are members that provide the wave-shaped configuration of the planar conductor pattern 8b at the time of compression bonding of the base sheets 10.

The auxiliary members 9b" are strip-shaped sheet members provided on the upper principal surface of the base sheet 10h and having the same or essentially the same size as the auxiliary members 9b. The sheet members extend in the y-axis direction within the outline of the internal component 3 when viewed in a top view, and they are spaced apart in the y-axis direction.

Furthermore, the auxiliary members 9d" are strip-shaped sheet members provided on the upper principal surface of the base sheet 10f. The sheet members have the same or approximately the same size as the sheet members that serve as the auxiliary members 9b". The auxiliary members 9d" extend in the x-axis direction and are spaced apart in the y-axis direction so as not to overlap with the auxiliary members 9b" when viewed in a plan view in the z-axis direction.

The auxiliary members 9a" to 9d" preferably are formed by patterning copper foil on the principal surfaces of the base sheets 10a, 10c, 10f, and 10h. The auxiliary members 9a" to 9d" are formed using a similar material to the planar conductor patterns 8a and 8b and the pattern conductors 5 by a process similar to the processes of forming them.

In the above preferred embodiment, to ensure reliable joints between the internal component 3 and the via-conductors 6, etc., the first portion P1 preferably includes areas inside and around the outline of the internal component 3 when viewed in a top view. However, this is not limiting, and the manufacturer or other suitable material may set any portion of the main portion 2 that is desired to be resistant to deformation, as the first portion P1.

Further, in the above preferred embodiment, the concave portions 81a and the convex portions 82a extend along the y-axis, whereas the concave portions 81b and the convex portions 82b extend along the x-axis. However, the directions in which the concave portions 81a and 81b and the convex portions 82a and 82b extend can be set appropriately in accordance with the use and purpose of, for example, the circuit board 1.

Still further, in the above preferred embodiment, the concave portions 81a and 81b have been described as being perpendicular or substantially perpendicular to each other on the xy plane. However, this is not limiting, and the directions in which the concave portions 81a and 81b extend make any angle θ such that $0° \leq \theta \leq 180°$. However, it is preferable that the concave portions 81a and 81b be perpendicular or substantially perpendicular to each other on the xy plane or cross each other approximately at a perpendicular or substantially perpendicular angle, because they are rendered resistant to deformation by bending moments along both the x- and y-axes.

Yet further, in the above preferred embodiment, the main portion 2 includes two planar conductor patterns 8a and 8b. However, this is not limiting, and the main portion 2 is simply required to include at least one planar conductor pattern 8.

Yet further, in the above preferred embodiment, a plurality of sets of auxiliary members 9 preferably are provided above and below one planar conductor pattern 8. However, this is not limiting, and one set of auxiliary members 9 is simply required to be provided per planar conductor pattern 8.

Yet further, the above preferred embodiment has been described with respect to the example where the internal component 3 preferably is included in the main portion 2. However, the internal component 3 does not have to be incorporated in the main portion 2.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit board, comprising:
   a main portion including a plurality of base sheets made of a flexible material, the plurality of base sheets being stacked and pressure-bonded in a predetermined direction; and
   at least one planar conductor pattern provided in the main portion and including a concave portion and a convex portion; wherein
   the concave portion and the convex portion extend in a direction perpendicular or substantially perpendicular to the predetermined direction;
   the concave portion is sunken in a direction parallel or substantially parallel to the predetermined direction;
   the convex portion protrudes in an opposite direction to the direction in which the concave portion is sunken;
   the at least one planar conductor pattern includes a first planar conductor pattern with a concave portion and a convex portion extending in a first direction; and
   the circuit board further comprises a plurality of first auxiliary members provided on one principal surface of the first planar conductor pattern and extending in the first direction, the first auxiliary members being spaced apart in a third direction different from the first direction.

2. The circuit board according to claim 1, wherein
   the at least one planar conductor pattern further includes a second planar conductor pattern opposite to the first planar conductor pattern in the predetermined direction; and
   the second planar conductor pattern includes a concave portion and a convex portion extending in a second direction different from the first direction.

3. The circuit board according to claim 2, wherein the main portion further includes an internal electronic component provided between the first planar conductor pattern and the second planar conductor pattern.

4. The circuit board according to claim 2, further comprising a plurality of second auxiliary members provided on one principal surface of the second planar conductor pattern and extending in the second direction, the second auxiliary members being spaced apart in a fourth direction different from the second direction.

5. The circuit board according to claim 4, wherein the first auxiliary members and the second auxiliary members are made of a resin that is neither softened nor fluidized when the base sheets are stacked and bonded under pressure.

6. The circuit board according to claim 4, wherein the first auxiliary members and the second auxiliary members are made of patterned metal films attached to the base sheets.

7. The circuit board according to claim 4, wherein the first auxiliary members and the second auxiliary members are wiring patterns.

8. The circuit board according to claim 2, wherein the first planar conductor pattern and the second planar conductor pattern define ground conductors or capacitor electrodes.

9. The circuit board according to claim 4, further comprising:
   a plurality of third auxiliary members provided on the other principal surface of the first planar conductor pattern and extending in the first direction, the third auxiliary members being spaced apart in the third direction so as not to overlap with the first auxiliary members when viewed in a plan view in the predetermined direction; and
   a plurality of fourth auxiliary members provided on the other principal surface of the second planar conductor pattern and extending in the second direction, the fourth auxiliary members being spaced apart in the fourth direction so as not to overlap with the second auxiliary members when viewed in a plan view in the predetermined direction.

10. A method for producing a circuit board, comprising the steps of:
    preparing a plurality of base sheets made of a flexible material;
    forming a planar conductor pattern on at least one of the base sheets; and
    stacking the base sheets in a predetermined direction and bonding the base sheets under pressure, such that a concave portion and a convex portion extending in a direction perpendicular or substantially perpendicular to the predetermined direction are formed on the planar conductor pattern; wherein
    the concave portion is sunken in a direction parallel or substantially parallel to the predetermined direction;
    the convex portion protrudes in an opposite direction to the direction in which the concave portion is sunken;
    the at least one planar conductor pattern includes a first planar conductor pattern with a concave portion and a convex portion extending in a first direction; and
    the method further comprises the step of forming a plurality of first auxiliary members on one principal surface of the first planar conductor pattern and extending in the first direction, the first auxiliary members being spaced apart in a third direction different from the first direction.

11. The method according to claim 10, wherein
    the at least one planar conductor pattern further includes a second planar conductor pattern opposite to the first planar conductor pattern in the predetermined direction; and
    the second planar conductor pattern includes a concave portion and a convex portion extending in a second direction different from the first direction.

12. The method according to claim 11, wherein the main portion further includes an internal electronic component provided between the first planar conductor pattern and the second planar conductor pattern.

13. The method according to claim 11, further comprising forming a plurality of second auxiliary members on one principal surface of the second planar conductor pattern and extending in the second direction, the second auxiliary members being spaced apart in a fourth direction different from the second direction.

14. The method according to claim 13, wherein the first auxiliary members and the second auxiliary members are made of a resin that is neither softened nor fluidized when the base sheets are stacked and bonded under pressure.

15. The method according to claim 13, wherein the first auxiliary members and the second auxiliary members are wiring patterns.

16. The method according to claim 13, wherein the first auxiliary members and the second auxiliary members are wiring patterns.

17. The method according to claim 11, wherein the first planar conductor pattern and the second planar conductor pattern define ground conductors or capacitor electrodes.

18. The method according to claim 13, further comprising:

forming a plurality of third auxiliary members on the other principal surface of the first planar conductor pattern and extending in the first direction, the third auxiliary members being spaced apart in the third direction so as not to overlap with the first auxiliary members when viewed in a plan view in the predetermined direction; and forming a plurality of fourth auxiliary members on the other principal surface of the second planar conductor pattern and extending in the second direction, the fourth auxiliary members being spaced apart in the fourth direction so as not to overlap with the second auxiliary members when viewed in a plan view in the predetermined direction.

* * * * *